United States Patent
Gauthier et al.

(10) Patent No.: US 6,838,323 B2
(45) Date of Patent: Jan. 4, 2005

(54) DIFFUSION RESISTOR/CAPACITOR (DRC) NON-ALIGNED MOSFET STRUCTURE

(75) Inventors: Robert J. Gauthier, Hinesburg, VT (US); Edward J. Nowak, Essex Junction, VT (US); Xiaowei Tian, Essex Junction, VT (US); Minh H. Tong, Essex Junction, VT (US); Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/341,182

(22) Filed: Jan. 13, 2003

(65) Prior Publication Data

US 2003/0102513 A1 Jun. 5, 2003

Related U.S. Application Data

(62) Division of application No. 09/272,433, filed on Mar. 19, 1999, now abandoned.

(51) Int. Cl.[7] .......................... H01L 21/00; H01L 23/62
(52) U.S. Cl. ..................... 438/155; 438/179; 257/355; 257/358; 257/363
(58) Field of Search .................. 257/386–387, 257/389, 395, 355, 358, 360, 363, 364; 438/161, 179, 286, 155, 383

(56) References Cited

U.S. PATENT DOCUMENTS

| | | | |
|---|---|---|---|
| 3,403,270 A | 9/1968 | Pace et al. | |
| 3,636,385 A | 1/1972 | Koepp | |
| 4,617,482 A | 10/1986 | Matsuda | |
| 4,720,737 A | 1/1988 | Shirato | |
| 4,786,956 A | 11/1988 | Puar | |
| 4,893,159 A | 1/1990 | Suzuki et al. | |
| 4,987,465 A * | 1/1991 | Longcor et al. | 257/357 |
| 5,208,475 A | 5/1993 | Mortensen | |
| 5,430,602 A | 7/1995 | Chin et al. | |
| 5,436,484 A | 7/1995 | Iwai et al. | |
| 5,557,130 A | 9/1996 | Orchard-Webb | |
| 5,563,525 A | 10/1996 | Lee | |
| 5,565,790 A | 10/1996 | Lee | |
| 5,579,200 A | 11/1996 | Rajkanan et al. | |
| 5,610,089 A | 3/1997 | Iwai et al. | |
| 5,640,299 A | 6/1997 | Leach | |
| 5,663,678 A | 9/1997 | Chang | |
| 5,701,024 A | 12/1997 | Watt | |
| 5,744,841 A * | 4/1998 | Gilbert et al. | 257/360 |
| 5,804,860 A * | 9/1998 | Amerasekera | 257/361 |
| RE36,024 E * | 1/1999 | Ho et al. | 257/356 |
| 6,236,086 B1 * | 5/2001 | Cheng | 257/355 |
| 6,563,176 B2 * | 5/2003 | Gauthier et al. | 257/360 |
| 6,586,806 B1 * | 7/2003 | Pai et al. | 257/401 |

* cited by examiner

Primary Examiner—Tom Thomas
Assistant Examiner—José R. Diaz
(74) Attorney, Agent, or Firm—DeLio & Peterson, LLC; Kelly M. Reynolds

(57) ABSTRACT

A structure and process for making a non-aligned MOSFET structure for ESD protection using resistor wells as the diffusions and adjustable capacitors. The present invention compensates the shallow extension region without the need for additional masks. The source/drain doping is less than that of a normal MOSFET but extends deeper into the silicon since the present invention uses a resistor well as the source/drain. The deeper emitter/collector increases the second trigger current of the NFET when used as an ESD protection device.

13 Claims, 7 Drawing Sheets

DIFFUSION RESISTOR/CAPACITOR (DRC) NON-ALIGNED MOSFET STRUCTURE

This is a divisional Ser. No. 09/272,433 filed on Mar. 19, 1999, now abandoned.

BACKGROUND OF THE INVENTION

1. Field of the Invention

This invention relates to semiconductor circuits and structures. More specifically, this invention relates to a non-aligned MOSFET structure and process using resistors as the diffusions and capacitors as the gate for electrostatic discharge (ESD) protection.

2. Description of Related Art

Protection against ESD is a familiar problem in the design of semiconductor devices. It is common to use an NMOS FET device in bipolar mode (parasitic npn) with N+ type diffusions for the source and drain, and a channel formed in a P-well in a P-type substrate, as protection against ESD. In an NMOS FET, the source of the FET forms the emitter of the bipolar, the FET channel region between drain to source forms the base, and the drain forms the collector. When electron and holes are created by avalanche multiplication at the drain, the holes forward-bias the base-emitter junction and the parasitic bipolar turns on once the local substrate bios meets or exceeds approximately 0.7 volts (vbe). During normal operations, the NPN beneath the FET is turned off. During an ESD event, the NPN turns on at a trigger voltage and clamps the ESD voltage at the protected node (sustaining/holding voltage).

In today's advanced CMOS technologies, the NFET device used in parasitic bipolar npn mode during an ESD event is of limited use due to its relatively low second trigger current (It2), also known as thermal runaway current. The parasitic npn emitter consists of only a small section of the N-extension/source-drain sidewall due to the high vertical field, thus causing the bipolar action to occur mainly along the silicon/SiO2 interface. Since the effective emitter area of the bipolar during avalanche conditions is formed in a shallow region, the current density becomes very large during an avalanche/ESD event and causes a significant temperature increase in the region.

The problem with the typical NFET device used for ESD protection thus becomes twofold. First, the high vertical field causes the emitter/base/collector region of the bipolar to occur at the Si/SiO2 surface where the shallow extension region exists. This results in a high current density through this region during an ESD event. Second, the lighter doping in the extension region, combined with the high current density during an ESD event, causes a significant increase in the temperature of the silicon where the bipolar action is occurring, compared to the temperature in that region if the extension is not present. The NFET becomes a more efficient ESD device when the doping level and depth of the emitter/collector (extension region) is increased. This reduces the temperature in the silicon and increases the emitter efficiency in the extension region.

One way to increase the doping level in the emitter/collector is to eliminate the extension so that the emitter/collector is formed on the junction side wall instead of the extension side wall. A second way to reduce the impact of the extension is to form a deeper implant in the extension region.

Prior publications have disclosed using additional implants that are implanted at a higher dose/energy than the extension implant. Adding additional dopant into the extension region at a higher energy than the extension implant, makes the extension deeper and reduces the temperature in the silicon during an ESD event. The drawback to this prior art is that the process requires an additional mask.

The proposed invention increases the doping concentration and depth of the emitter/collector creating a more efficient bipolar. The device therefore operates at a lower temperature during an ESD event due to the reduced current density through the higher doped, deeper junctions which form the emitter/collector regions.

Bearing in mind the problems and deficiencies of the prior art, it is therefore an object of the present invention to provide a method and structure to decrease the current density and joule heating in an NFET ESD protection device during an ESD event.

It is another object of the present invention to provide a method and structure of reducing the current density through the shallow emitter area during an ESD event.

A further object of the invention is to provide a method and structure to lower the operating temperature of the emitter region during an ESD event.

It is yet another object of the present invention to provide a method and structure to form the emitter/collector on the junction side wall instead of the extension side wall.

It is yet still a further object of the present invention to provide a method and structure to implant a deeper implant into the extension region.

Another object of the present invention is to provide a method and structure to increase the doping level in the emitter/collector and eliminate the extension region.

Finally, yet another object of the present invention is to provide a method and structure to eliminate the need for additional masks in forming an NFET ESD protection device.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a non-self aligned MOSFET transistor for ESD protection comprising a substrate having a source diffusion region and a drain diffusion region. A first resistor well is implanted into the source diffusion region on the substrate to form a first resistor well and a second resistor well is implanted into the drain diffusion region on the substrate to form a second resistor well. The first and second resistor well have a junction depth extending into the substrate which can extend to approximately 0.40 um. In the preferred embodiment, the depth of each junction is variable. The first resistor well and second resistor are spaced apart to define a channel region there between which connects the first and second resistor wells. A gate oxide layer and a gate electrode are deposited on top of the channel to form a gate. An N-extension mask may be placed over the gate electrode and implanted into the gate.

In the preferred embodiment, the gate oxide layer is silicon oxide and the gate electrode is polysilicon. The gate oxide layer and gate electrode extend on top of and overlap the first and second resistor wells to form first and second overlap regions. It is preferred that the amount of overlap of the first and second overlap regions is variable. A variable capacitor may be formed between the gate electrode and drain diffusion region by the overlap in the second overlap region and a variable resistor-capacitor controlled network may be formed on the gate electrode of the MOSFET by the variable capacitor in combination with the first resistor well.

In another embodiment, a silicide blocking mask can be deposited above the first and second resistor wells to inhibit the formation of silicide and deepen the junction depths of the first and second resistor wells.

The device may further include a third resistor tub overlying and embedded in the second resistor well to form a resistor ballasted NFET.

In another aspect, the present invention relates to a method of manufacturing a non-self aligned MOSFET transistor for ESD protection comprising first providing a substrate having a source diffusion region and a drain diffusion region. A first resistor tub is implanted into the source diffusion region forming a first resistor well having a first junction depth and a second resistor tub is implanted into the drain diffusion region forming a second resistor well having a second junction depth. The depths of the first and second junction depths can extend to approximately 0.40 um. It is preferred that the junction depths of the first and second junctions be variable. The first resistor well is separated from the second resistor well by a channel region there between and a gate oxide layer and gate electrode are deposited over the channel region to form a gate.

In the preferred embodiment, the gate oxide layer is silicon oxide and the gate electrode is polysilicon. It is also preferred that the gate oxide layer extends onto and overlaps the first and second resistor wells to define a first and second overlap region.

In a preferred embodiment, a n-extension mask is formed over the top of the gate electrode and the mask is implanted into the gate.

In another aspect, the invention further includes the step, prior to the step of depositing the gate oxide layer and gate electrode, of depositing a silicide blocking mask over the first and second resistor wells. The blocking mask inhibits the formation of silicide, thereby deepening the junction depths of the first and second resistor wells.

The method may further comprise the step of overlying and embedding a third resistor tub in the second resistor well to form a resistor ballasted NFET.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
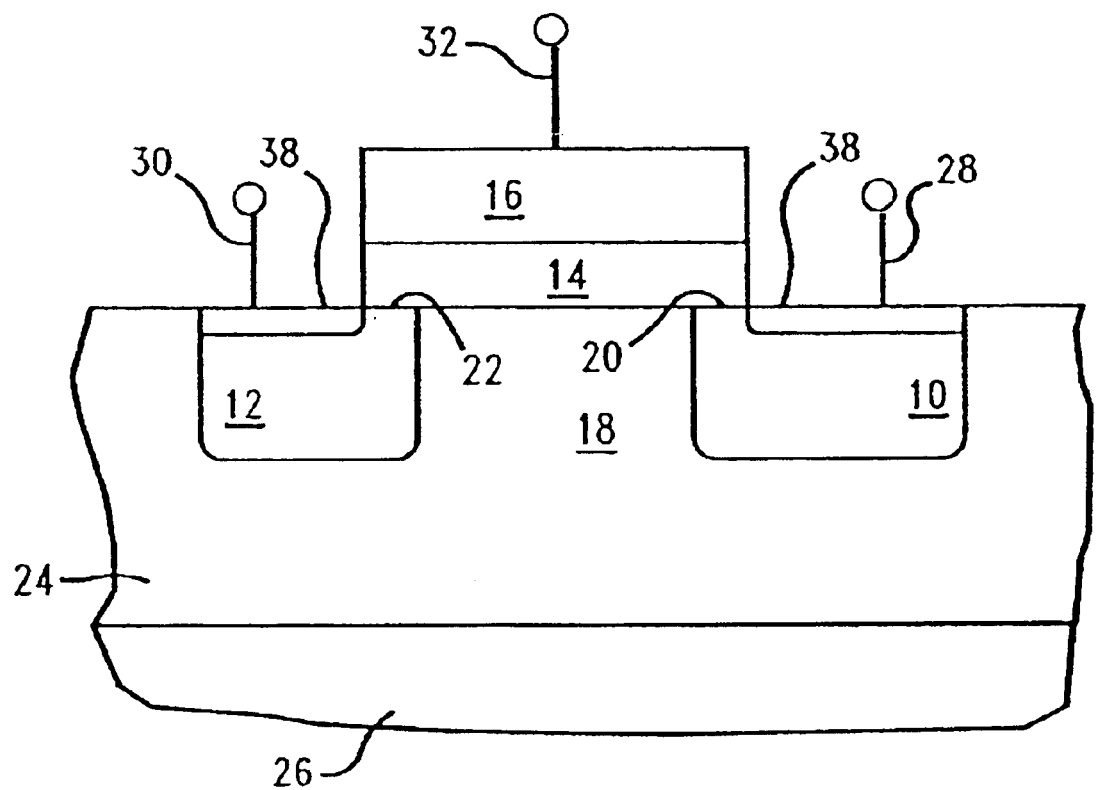
FIG. 1 is an elevational view of a semiconductor structure showing the ESD protection device of this invention.

In describing the preferred embodiment of the present invention, reference will be made herein to FIGS. 1–7 of the drawings in which like numerals refer to like features of the invention. Features of the invention are not necessarily shown to scale in the drawings.

The present invention creates a MOSFET like structure for ESD protection using resistor wells as the diffusions and adjustable capacitors. The device compensates the shallow extension region without the need for additional masks. The source/drain doping is less than that of a normal MOSFET but extends deeper into the silicon since the present invention uses a resistor well as the source/drain. The deeper emitter/collector increases the second trigger current of the NFET when used as an ESD protection device.

Figure 2:
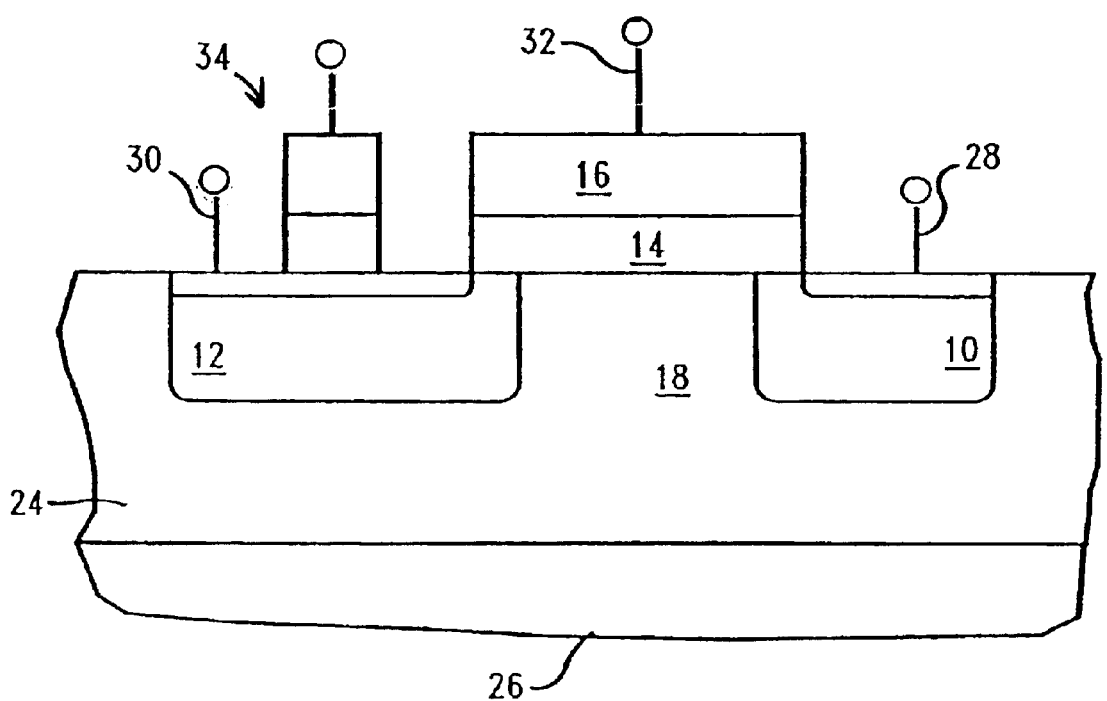
FIG. 2 is an elevational view of a semiconductor structure showing a resistor ballasted NFET ESD protection device.

As shown in FIG. 1, the present invention provides a MOS device using resistor wells 10, 12 as the MOSFET source 28/drain 30 implants. The device of the present invention may be formed by first implanting a first resistor well 10 and a second resistor well 12 on a starting wafer 24, as shown in FIG. 2, where the starting wafer could be epi, no epi or silicon on insulator ("SOI"). The first resistor well 10 and second resistor well 12 are spaced apart to define a channel region 18. After implanting the resistor wells 10, 12, a gate oxide layer 14 and a gate electrode 16 are deposited on top of the p-type EPI 24 to form gate 32 (as shown in FIG. 1). The gate oxide layer may be silicon dioxide and the gate electrode may be polysilicon. The gate oxide layer 14 and gate electrode 16 are deposited on top of the channel 18 and extend onto and overlap the first 10 and second 12 resistor wells. The overlap creates a first 20 and second 22 overlap region.

While the embodiment of FIG. 1 illustrates the formation of the resistor wells on a p-type EPI 24 and p+ type bulk substrate 26, or wafer, the resistor wells of the present invention can be formed on any starting wafer, such as p–, p+, n–, n+ or bulk or SOI CMOS.

In the conventional process a MOS transistor typically consists of a gate electrode that has been deposited on a thin dielectric layer over the substrate, with electrically conductive source and drain regions formed in the substrate on opposing sides of the gate electrode. The conductive regions are separated by the channel, a poorly conductive region under the gate electrode. Unlike the conventional process of forming a MOSFET, in the present invention the first and second resistor wells are formed first so as to position the resistor wells and create the overlap. A drawback to the present invention is that the device cannot have a minimum MOSFET channel length due to the overlay tolerance of the resistor well mask.

After the gate electrode 32 is formed, an N-extension mask can be used to form, as shown in FIG. 1, lightly doped implants 38 only into upper portions of resistor wells 10 and 12, which is favorable for the poly-depletion effects.

Figure 3:
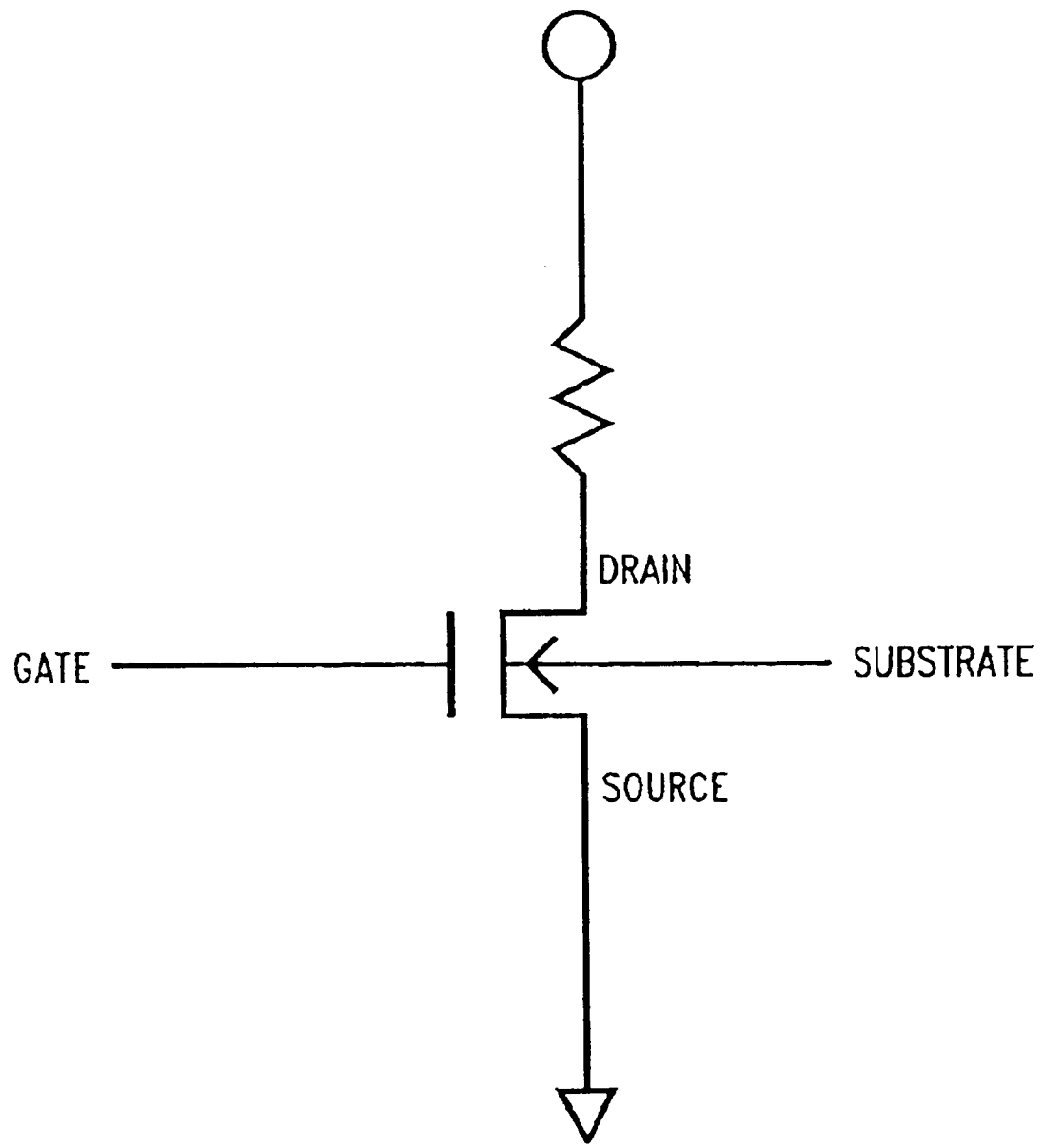
FIG. 3 is a schematic representation of FIG. 2.

A third resistor may be provided over the second resistor well 12 to create a resistor ballasted FET 34 as shown in FIG. 2. Resistor ballasting is a common technique used for ESD protection and makes the design more compact. FIG. 3 is a schematic of the resistor ballasted FET of FIG. 2.

Figure 4:
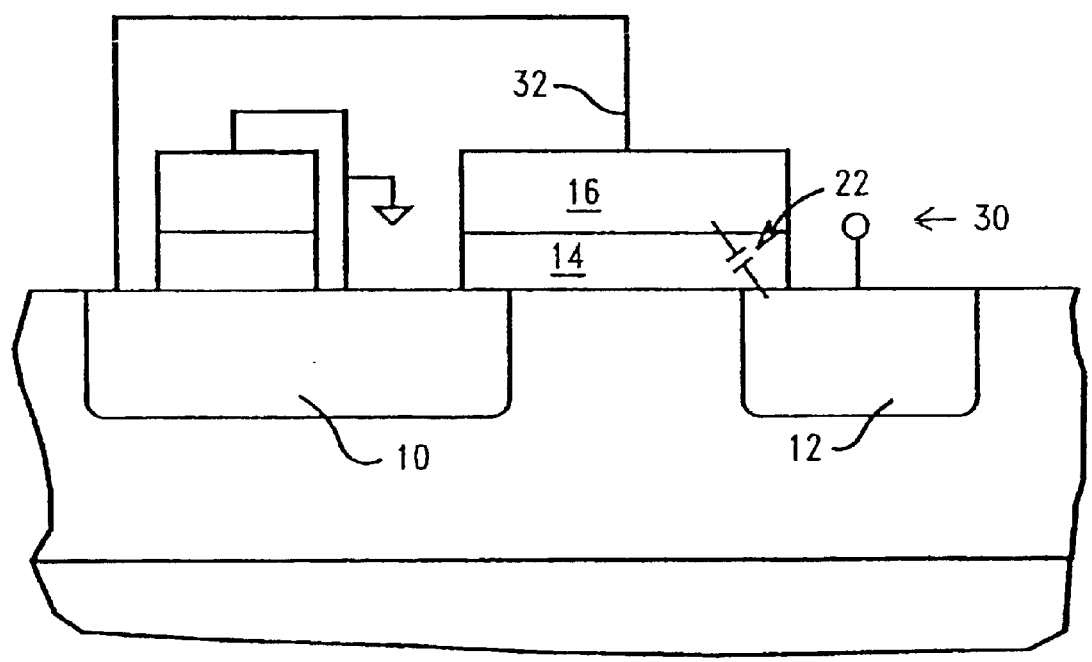
FIG. 4 is an elevational view of a semiconductor structure showing the resistor capacitor triggered NFET of this invention.
Figure 5:
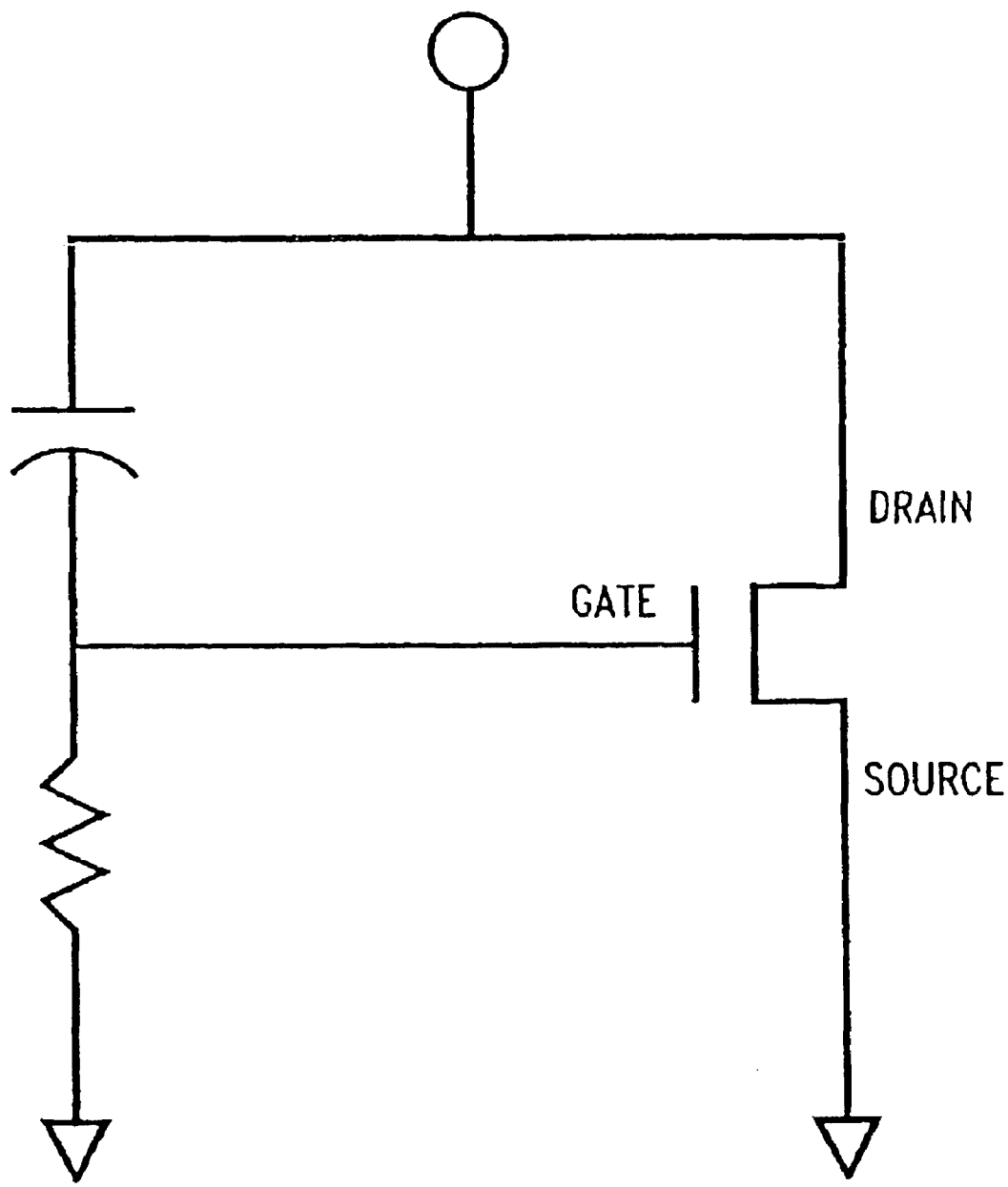
FIG. 5 is a schematic representation of FIG. 4.

The present invention can also be used as a resistor/capacitor gate triggered FET. In the conventional RC triggered FET circuit, the capacitor and resistor are external to the FET and connected by wiring. In the present invention as shown in FIG. 4, the overlapping region 22 between the gate 32 and drain 30, creates a variable capacitance which can be tailored as needed for the RC triggered NFET. The junction depth of the second resister well 12 can be tailored to adjust resistance needed for the RC circuit. FIG. 5 is a schematic of this circuit.

Figure 6:
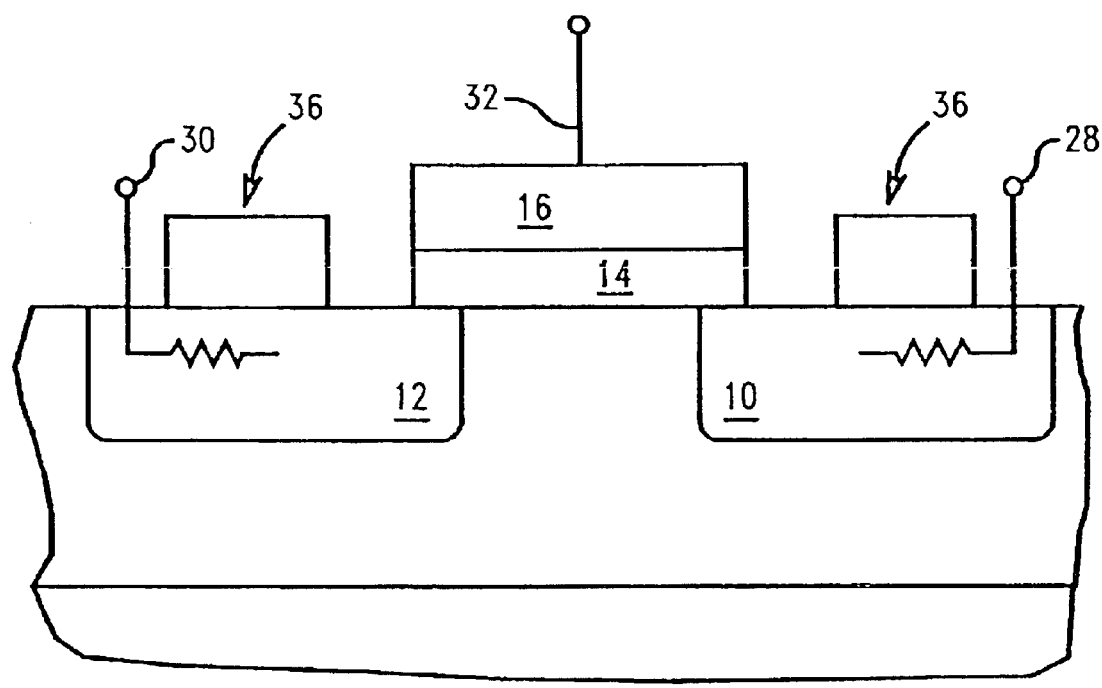
FIG. 6 is an elevational view of a semiconductor structure showing the use of a silicide blocking mask in the formation of the ESD protection device of this invention.
Figure 7:
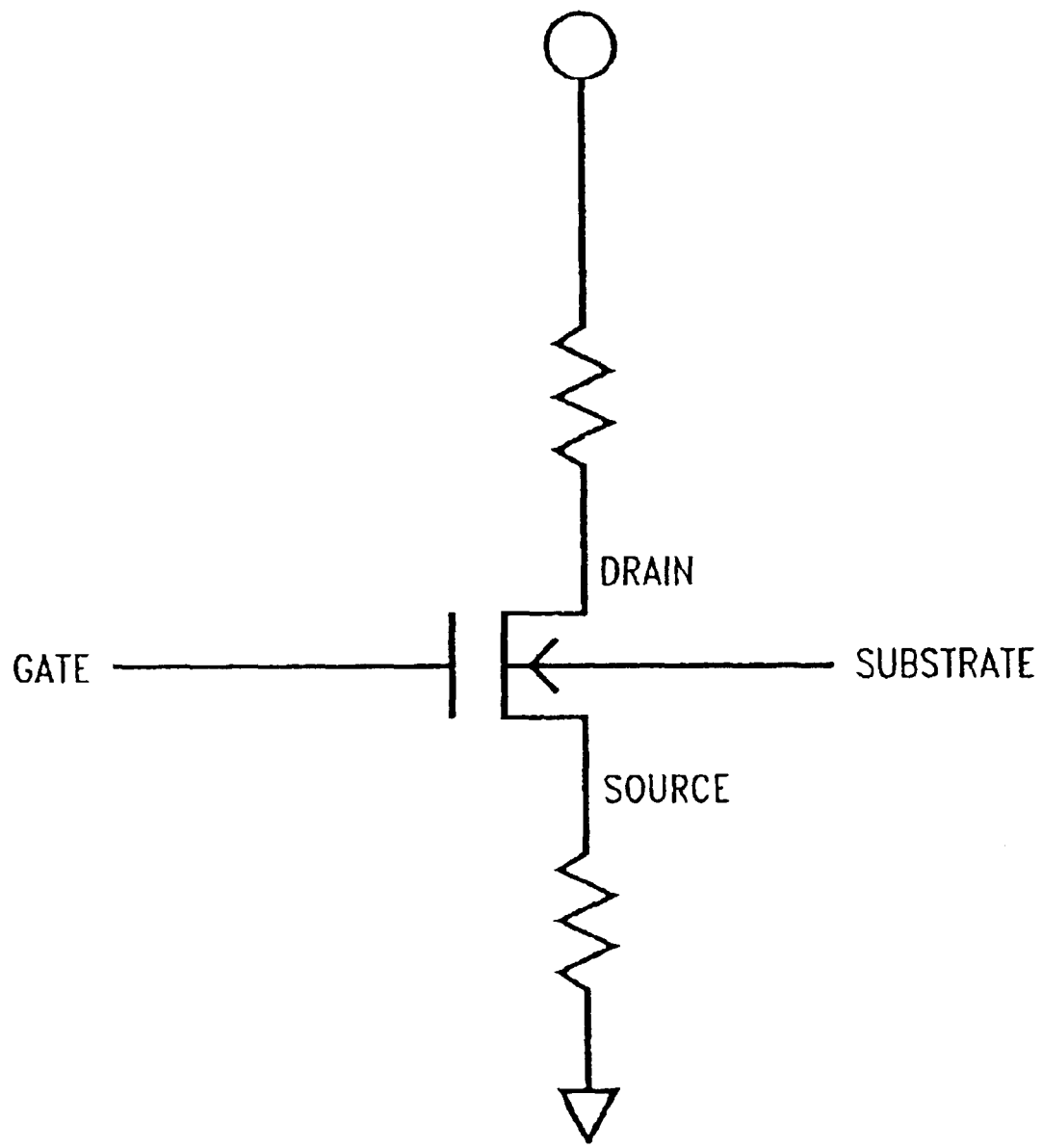
FIG. 7 is a schematic representation of FIG. 6.

As shown in FIGS. 6 and 7, a silicide blocking mask 36 is deposited over the first and second resistor wells 10, 12. The silicide blocking mask 36 helps decrease the current density at the surface increasing second trigger current. The silicide blocking mask 36 also results in the elimination of localized hot spots (thin spots of silicide thickness) occurring in a silicided process. The use of the silicide blocking mask 36 is a standard embodiment and can be used in combination with any one of the DRC-MOSFET configurations previously described.

In a standard MOSFET, the extension region is about 0.1 um deep and the source/drain region about 0.2 um deep. In the present invention, the junction depths of the resistor wells is preferably about 0.18 um, or more preferably from about 1.5 to 2 times the junction depth of a standard MOSFET n+ junction, or approximately 0.40 um.

The proposed invention provides the advantage of allowing the device to operate at a lower temperature during an ESD event due to the reduced current density through the higher doped, deeper junctions, which form the emitter/collector regions. Current density and joule heating through the shallow emitter area during an ESD event is reduced, all without the need for additional masks.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of manufacturing a non-aligned MOSFET transistor for ESD protection comprising the steps:
providing a substrate having a source diffusion region and a drain diffusion region;
implanting a first resistor well implant as a source diffusion into said source diffusion region;
implanting a second resistor well implant as a drain diffusion into said drain diffusion region, thereby forming a channel region that connects said first and second resistor well implants;
forming a non-self aligned gate over said first and second resistor well implants therein forming a first overlap region of said non-self aligned gate over said first resistor well implant and a second overlap region of said non-self aligned gate over said second resistor well implant;
exposing a portion of each said first resistor well implant and said second resistor well implant; and
implanting lightly doped implants only into upper portions of each said exposed portions of said first resistor well implant as said source diffusion and said second resistor well implant as said drain diffusion such that said lightly doped implants reside entirely within said first and second resistor well implants,
wherein said second overlap region extends over said second resistor well implant to a different extent than said first overlap region extends over said first resistor well implant to form a variable capacitance between said gate and said second resistor well implant.

2. The method of claim 1 wherein the non-self aligned gate is formed by depositing a gate electrode directly over a gate oxide layer.

3. The method of claim 2 wherein the gate oxide layer is silicon oxide and the gate electrode is polysilicon.

4. The method of claim 1 wherein the first and second resistor well implants each have a junction depth extending into the substrate to approximately 0.40 μm.

5. The method of claim 1 wherein the first and second resistor well implants each have a junction depth extending into the substrate that is at approximately 0.3 μm deep.

6. The method of claim 1 further comprising the step of forming an n-extension mask over the top of said non-self aligned gate prior to implanting said lightly doped implants.

7. The method of claim 1 further comprising the step of depositing a suicide blocking mask over the first and second resistor wells.

8. The method of claim 1 further comprising the step of overlying a third resistor in the second resistor well to form a resistor ballasted NFET.

9. A method of manufacturing a non-aligned MOSFET transistor for ESD protection comprising the steps:
providing a substrate having a source diffusion region and a drain diffusion region;
implanting a first resistor well implant as a source diffusion into said source diffusion region;
implanting a second resistor well implant as a drain diffusion into said drain diffusion region, thereby forming a channel region that connects said first and second resistor well implants;
forming a non-self aligned gate over said first and second resistor well implants by depositing a gate oxide layer overlapping and directly contacting said first and second resistor well implants followed by depositing a gate electrode entirely covering said oxide layer, said non-self aligned gate forming first and second overlap regions whereby said second overlap region extends over said second resistor well implant more than said first overlap region extends over said first resistor well implant to form a variable capacitance between said gate and said second resistor well implant;
implanting lightly doped implants only into exposed portions of each of said first resistor well implant as said source diffusion and said second resistor well implant as said drain diffusion such that said lightly doped implants reside entirely within and in upper portions of said first and second resistor well implants; and
forming a resistor-capacitor circuit on said non-self aligned gate for triggering said non-aligned MOSFET transistor for ESD protection, said resistor-capacitor circuit comprising said variable capacitance in combination with an adjustable resistance yielded by said second resistor well implant being tailored to a predetermined junction depth.

10. The method of claim 9 wherein the gate oxide layer is silicon oxide and the gate electrode is polysilicon.

11. The method of claim 9 wherein the first and second resistor well implants each have a junction depth extending into the substrate that is at approximately 0.3 μm deep.

12. The method of claim 9 further comprising the step of forming an n-extension mask over the top of said non-self aligned gate prior to implanting said lightly doped implants.

13. The method of claim 9 wherein said tailored second resistor well has an adjustable junction depth ranging from about 0.18 μm to about 0.40 μm for adjusting resistance needed for said resistor-capacitor circuit.

* * * * *